(12) United States Patent
BrightSky et al.

(10) Patent No.: US 8,921,820 B2
(45) Date of Patent: Dec. 30, 2014

(54) PHASE CHANGE MEMORY CELL WITH LARGE ELECTRODE CONTACT AREA

(71) Applicant: International Business Machines Corporation, Armonk, NY (US)

(72) Inventors: Matthew J. BrightSky, Pound Ridge, NY (US); Chung H. Lam, Peekskill, NY (US); Jing Li, Ossining, NY (US); Alejandro G. Schrott, New York, NY (US); Norma E. Sosa Cortes, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/717,701

(22) Filed: Dec. 18, 2012

(65) Prior Publication Data

US 2014/0166962 A1    Jun. 19, 2014

(51) Int. Cl.
| | | |
|---|---|---|
| *H01L 29/00* | (2006.01) | |
| *H01L 47/00* | (2006.01) | |
| *H01L 29/04* | (2006.01) | |
| *H01L 29/06* | (2006.01) | |
| *H01L 47/02* | (2006.01) | |
| *H01L 45/00* | (2006.01) | |

(52) U.S. Cl.
CPC ............ *H01L 45/1253* (2013.01); *H01L 45/16* (2013.01)
USPC ................ 257/4; 257/1; 257/2; 257/3; 257/5; 257/6

(58) Field of Classification Search
USPC .......................................................... 257/1–6
See application file for complete search history.

(56) References Cited

U.S. PATENT DOCUMENTS

| | | | |
|---|---|---|---|
| 2009/0057643 A1* | 3/2009 | Chen ................................ | 257/4 |
| 2010/0054029 A1* | 3/2010 | Happ et al. .................... | 365/163 |
| 2010/0155687 A1* | 6/2010 | Reyes et al. ....................... | 257/4 |

\* cited by examiner

*Primary Examiner* — Steven Loke
*Assistant Examiner* — Juanita B Rhodes
(74) *Attorney, Agent, or Firm* — Ido Tuchman; Louis J. Percello

(57) ABSTRACT

A phase change memory cell and a method for fabricating the phase change memory cell. The phase change memory cell includes a bottom electrode and a first non-conductive layer. The first non-conductive layer defines a first well, a first electrically conductive liner lines the first well, and the first well is filled with a phase change material in the phase change memory cell.

12 Claims, 8 Drawing Sheets

PHASE CHANGE MEMORY CELL WITH LARGE ELECTRODE CONTACT AREA

BACKGROUND

This invention relates to computer memory, and more particularly to a method for fabricating phase change memory cells.

Phase change memory cells are known to have failure modes. One example is an endurance failure that occurs after cycling a phase change memory cell many times between the crystalline (SET) and amorphous (RESET) states. Phase change memory cycling results in the phase change material becoming disconnected from an electrode and causing the cell to be electrically open with no current passing through. A root cause of this failure is a separation of the phase change material from a bottom electrode material.

Another example is a process induced failure leading to delamination of a phase change material. In this failure mode, high temperature processes throughout the processing of an integrated structure cause the phase change material shrink and form voids at corners. This causes the phase change material in the phase change memory cell to delaminate at its interfaces leaving the cell electrically open with no current passing through.

BRIEF SUMMARY

Accordingly, one example aspect of the present invention is a phase change memory cell. The phase change memory cell includes a bottom electrode and a non-conductive layer deposited above the bottom electrode. The non-conductive layer defines a well. The well is positioned above the bottom electrode. An electrically conductive liner lines the well. The electrically conductive liner at least partially lines the well and is in electrical contact with the bottom electrode. A phase change material is deposited in the well. The phase change material is in electrical contact with the electrically conductive liner.

Another example of the present invention is a method for fabricating a phase change memory cell. The method includes forming a bottom electrode and depositing a non-conductive layer above the bottom electrode. A defining step defines a well of arbitrary shape in the non-conductive layer and a lining step is used to line an electrically conductive liner along the side(s) and bottom of the well. A depositing step deposits a phase change material in the well such that the phase change material is in electrical contact with the electrically conductive liner. The electrically conductive liner is also in electrical contact with the bottom electrode.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1A:
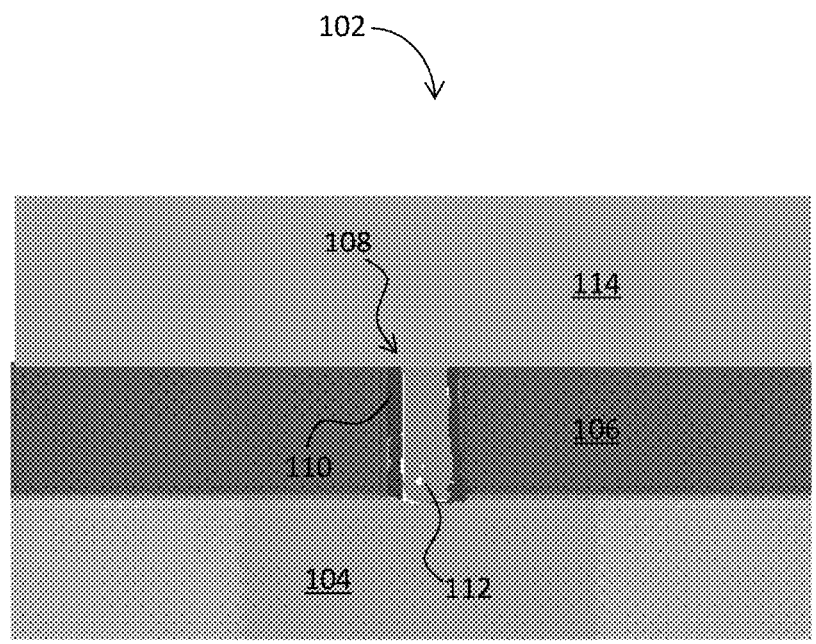
FIG. 1A shows a phase change memory cell according to one embodiment of the present invention.

The present invention is described with reference to embodiments of the invention. Throughout the description of the invention reference is made to FIGS. 1-6B. When referring to the figures, like structures and elements shown throughout are indicated with like reference numerals.

FIG. 1A shows a phase change memory cell 102 according to one embodiment of the present invention. The phase change memory cell 102 includes a bottom electrode 104 and a first non-conductive layer 106. The first non-conductive layer 106 is deposited above the bottom electrode 104 and defines a first well 108. As used herein, the term first well may also be referred to as a lower pore. The first well of arbitrary shape 108 is positioned directly above the bottom electrode 104. A first electrically conductive liner 110 lines at least one wall of the first well 108. As used herein, the term electrically conductive liner may also be referred to as an electrode material layer. The first electrically conductive liner 110 partially fills the first well 108 and is in electrical contact with the bottom electrode 104.

A phase change material 112 is deposited in the first well 108 and is in electrical contact with the electrically conductive liner 110. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

In one embodiment, glass chalcogenides are utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used as phase change material cell as long as they can retain separate amorphous and crystalline states.

The phase change memory cell 102 may further include a top electrode 114. The first electrically conductive liner 110 may be in physical contact with both the bottom electrode 104 and the top electrode 114. The phase change material 112 may also be in physical contact with both the bottom electrode 104 and the top electrode 114.

Figure 1B:
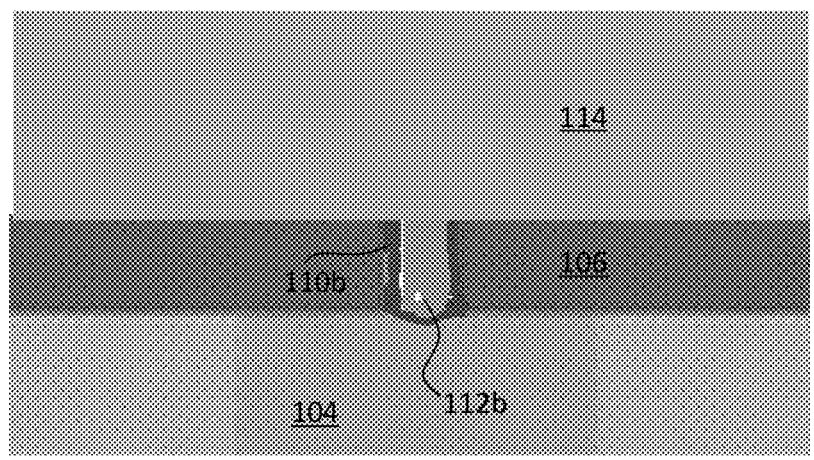
FIG. 1B shows another embodiment of a phase change memory cell contemplated by the present invention.

In one embodiment, the phase change material 112 is in physical contact with both the first electrically conductive liner 110 and the bottom electrode 104. Alternatively, as shown in FIG. 1B, the conductive liner 110 may line the bottom of the first well 108. Thus, the conductive liner 110 is physically positioned between the phase change material 112 and the bottom electrode 104.

Figure 2:
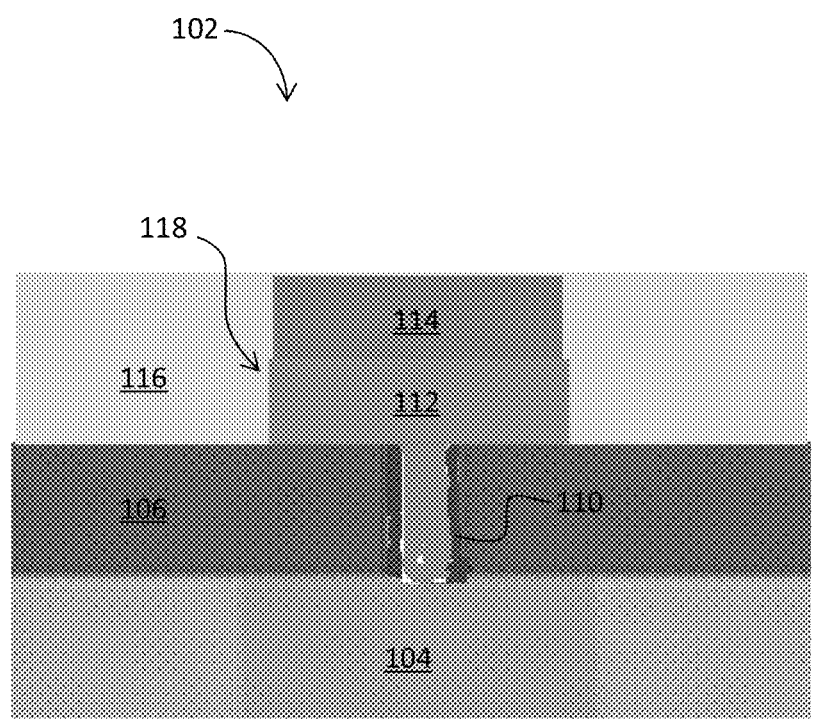
FIG. 2 shows the phase change memory cell according to another embodiment of the present invention.

FIG. 2 shows the phase change memory cell according to another embodiment of the present invention. As shown, the phase change memory cell 102 includes a second non-conductive layer 116 deposited above the first non-conductive layer 106. The second non-conductive layer 116 defines a second well 118. It is noted that the second non-conductive layer 116 may be the same material as the first non-conductive layer 106, thereby constituting a single unitary layer. Alternatively, the second non-conductive layer 116 and first non-conductive layer 106 may be composed of different materials. The wells formed in these layers (or layer) can be defined with an etch or any other method to form a well of arbitrary shape.

The second well 118 is positioned directly above the first well 108. The phase change material 112 is deposited in the second well 118. The phase change memory cell 102 may further include a top electrode 114 positioned above the second well 118. The top electrode 114 may be in physical contact with the phase change material 112 in the second well. Alternatively, phase change material is deposited to fill the first well and above the well, followed by the top electrode material deposition, and is then pattered with Reactive Ion Etching (RIE) and encapsulated with insulating layer 116.

Figure 3A:
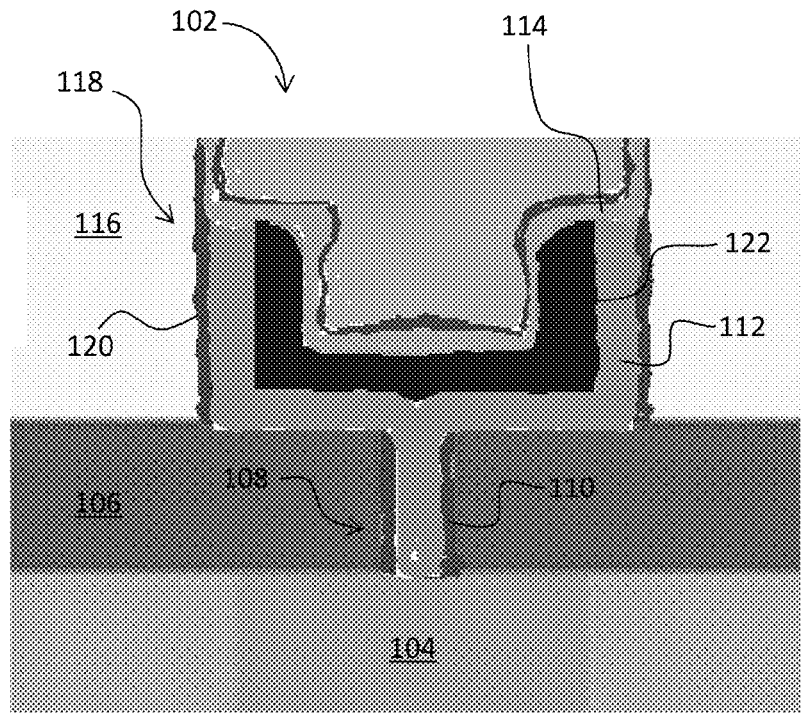
FIG. 3A shows a phase change memory cell according to one embodiment of the present invention.

FIG. 3A shows the phase change memory cell according to another embodiment of the present invention. As shown, the phase change memory cell 102 includes a second electrically conductive liner 120. The second electrically conductive liner 120 may line at least one wall of the second well 118. The second electrically conductive liner 120 may not be in physical contact with the first electrically conductive liner 110. In another embodiment, the second electrically conductive liner 120 may be in physical contact with the first electrically conductive liner 110.

In one embodiment, the phase change material 112 is deposited in the first well 108 and defines a cavity within the second well 118. The phase change memory cell 102 further includes a third non-conductive material layer 122. The third non-conductive layer 122 is deposited above the phase change material 112 and inside the second well 118. The phase change memory cell 102 may further include a top electrode 114. The top electrode 114 is positioned above the third non-conductive material layer 122. The top electrode 114 may be in physical contact with the third non-conductively material layer 122, the phase change material 112 layer, and the second electrically conductive liner 116. In one embodiment, the top electrode 114 may include materials such as Ti, TiN and W.

Figure 3B:
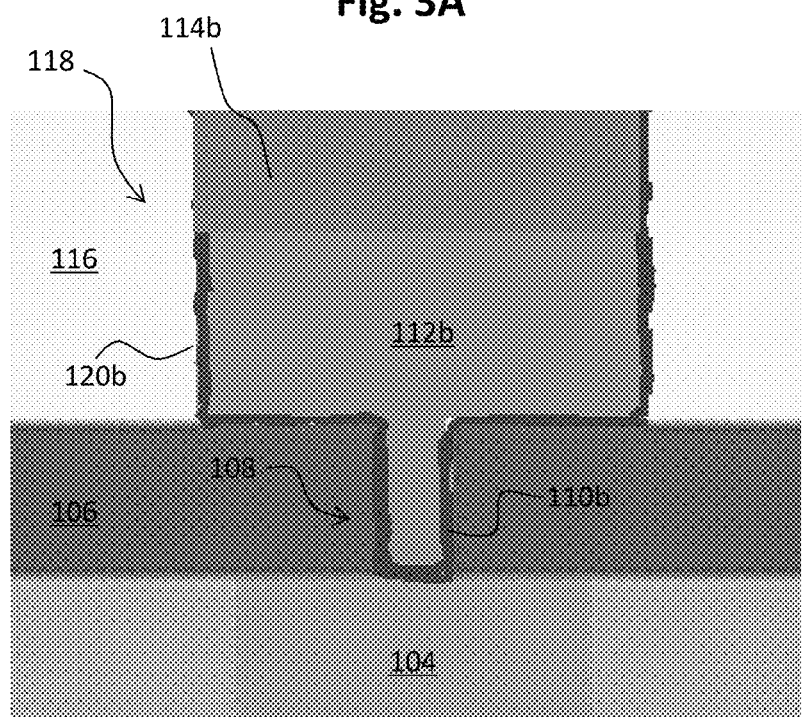
FIG. 3B shows another phase change memory cell according to one embodiment of the present invention.

In one embodiment, the phase change material 112 is in physical contact with both the first electrically conductive liner 110 and the bottom electrode 104. Alternatively, as shown in FIG. 3B, the conductive liner 120b may line the bottom of the first well 108. Thus, the conductive liner 120b is physically positioned between the phase change material 112b and the bottom electrode 104. Alternatively, the conductive liner 120b may also line the bottom of the first well 108. Thus, the conductive liner 120b is physically positioned between the phase change material 112b and the bottom electrode 104.

The conductive liner 120b may be in physical contact with both the bottom electrode 104 and the top electrode 114b. Thus, the conductive liner 120b and the phase change material are arranged in parallel circuit between the top and bottom electrodes. The resistance of the conductive liner material may be at least two times the resistance of the phase change material when in the fully crystalline (SET) state. The conductive liner thickness may be in the range of 0.5 nm to 5 nm and may be comprised of TiN, TaN, TaAlN, TaSiN, TiAlN, TiSiN, TiCN, or TaCN.

It is noted that the second non-conductive layer 116 may be the same material as the first non-conductive layer 106, thereby constituting a single unitary layer. Alternatively, the second non-conductive layer 116 and first non-conductive layer 106 may be composed of different materials. The wells formed in these layers (or layer) can be defined with an etch or any other method to form a well of arbitrary shape.

Figure 4:
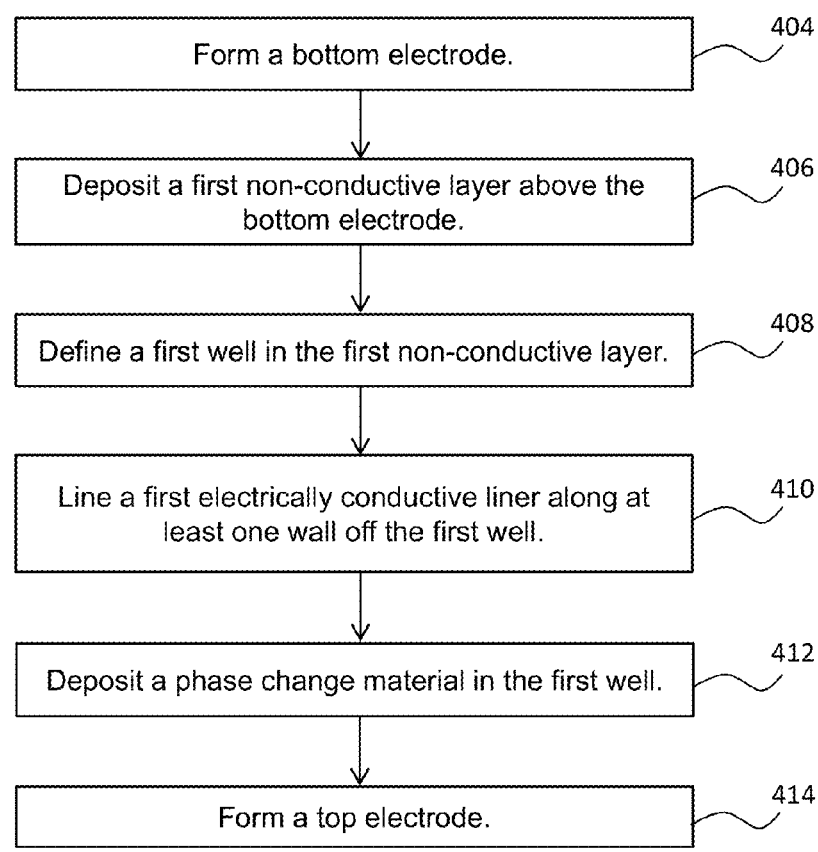
FIG. 4 shows a method for fabricating a phase change memory cell in accordance with one embodiment of the present invention.

FIG. 4 shows a method for fabricating a phase change memory cell in accordance with one embodiment of the present invention. The method includes forming step 404. During forming step 404, a bottom electrode is formed. The bottom electrode may comprise materials such as Ti, TiN and W. After forming step 404 is complete, the method continues to depositing step 406.

During depositing step 406, a first non-conductive layer is deposited above the bottom electrode. In one embodiment, the first non-conductive layer is made of SiN. After the depositing step 406 is complete, the method continues to defining step 408.

During defining step 408, a first well is defined in the first non-conductive layer. The first well is positioned directly above the bottom electrode. This step may include transferring a keyhole cavity down to the first non-conductive layer to form the first well. After the defining step 408 is complete, the method continues to lining step 410.

At lining step 410, a first electrically conductive liner is lined along at least one wall of the first well. The electrically conductive liner partially fills the first well and is in electrical contact with the bottom electrode. In one embodiment, the electrically conductive liner is TiN. In other embodiments the electrically conductive liner is TaN, TaAlN, TaSiN, TiAlN, TiSiN, TiCN, or TaCN. After lining step 410 is complete, the method continues to depositing step 412.

During depositing step 412, a phase change material is deposited in the first well. The phase change material may be in electrical contact with the electrically conductive liner. As discussed above, a variety of materials may be used for the phase change material. The phase change material may include $Ge_2Sb_2Te_5$. The phase change material may include $Sb_xTe_{1-x}$ material, where 0.4 $(Sb_2Te_3)<=x<=0.7$ $(Sb_7Te_3)$. The phase change memory cells may include $In_2Se_3$. After depositing step 412 is finished, the method proceeds to forming step 414.

At forming step 414, a top electrode is formed. The first electrically conductive liner may be in physical contact with both the bottom electrode and the top electrode. In one embodiment, the top electrode is TiN. The phase change material may be in physical contact with both the bottom electrode and the top electrode. In another embodiment the top electrode and the bottom electrode are comprised of TiAlN, or TaAlN, or TaN, or TiSiN, or TaSiN.

Figure 5A:
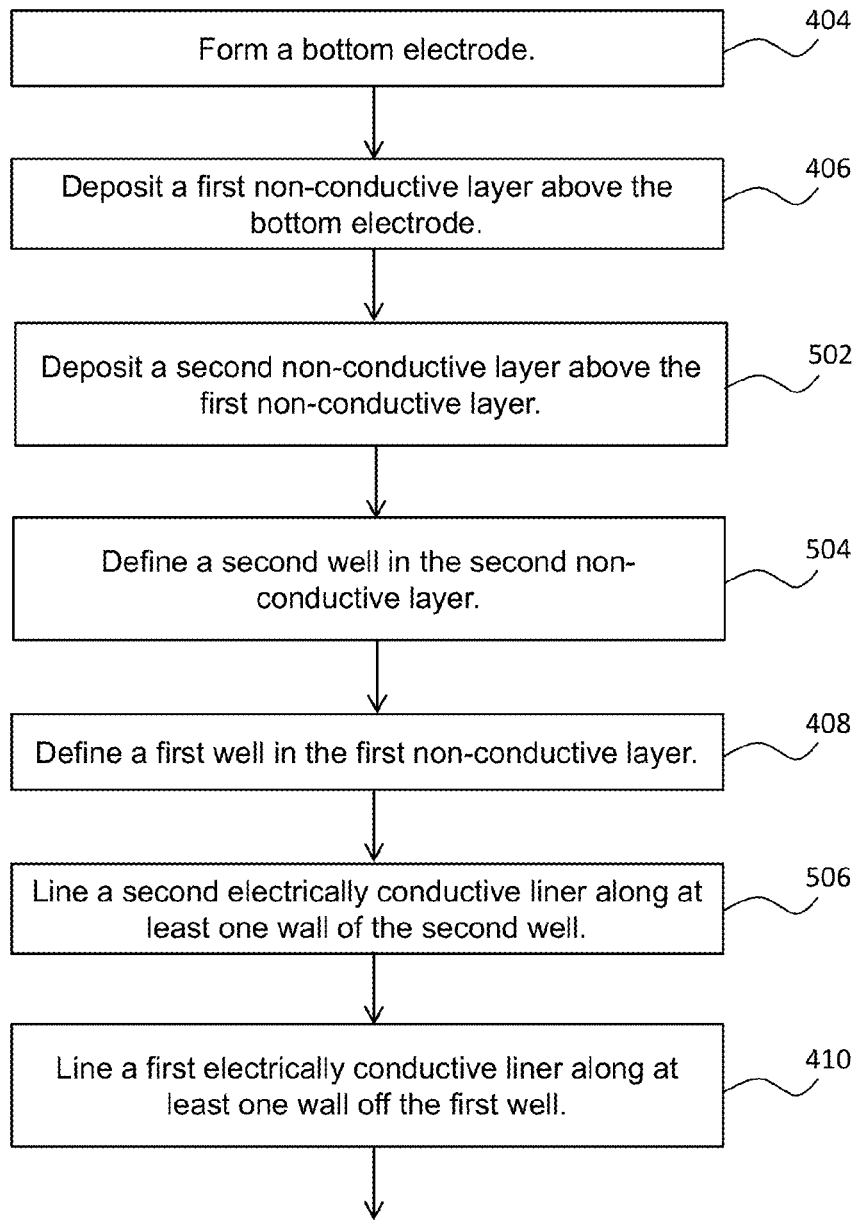
FIGS. 5A and 5B show a method for fabricating a phase change memory cell in accordance with one embodiment of the present invention.
Figure 5B:
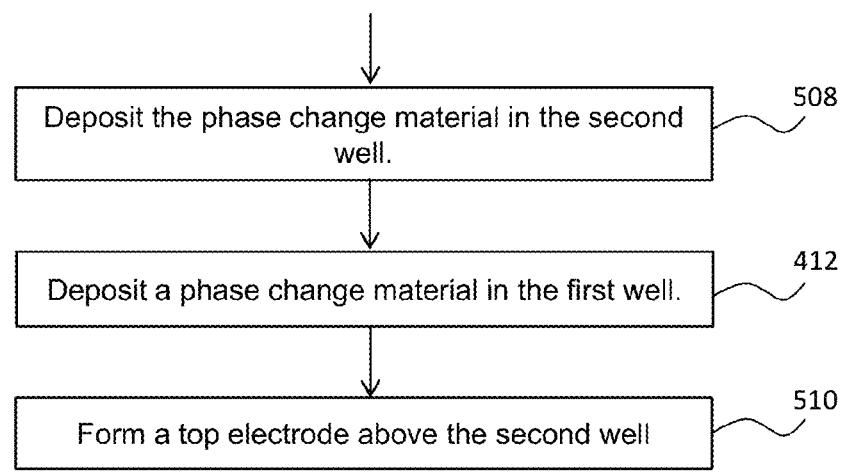

FIGS. 5A and 5B show another method for fabricating a phase change memory cell in accordance with one embodiment of the present invention. The method includes forming step 404, depositing step 406, defining step 408, lining step 410, and depositing step 412 discussed above.

After depositing step 406 is performed, the process continues to depositing step 502. At depositing step 502, a second non-conductive layer is deposited above the first non-conductive. In one embodiment, the second non-conductive layer is $SiO_2$. After depositing step 502 is finished, the method continues to defining step 504.

During the defining step 504, a second well is defined in the second non-conductive layer. In one embodiment, the second well is formed before the first well is defined at defining step 408. This step may include performing a lithographic etch and a buffered oxide etch (BOE) to create the second well, with an overhang above the second non-conductive layer. The second well is then filled with a conformal material such that a keyhole cavity is formed within the via. After defining step 418 is finished, the method continues to defining step 408.

As mentioned above, defining step 408 may include transferring the keyhole cavity down to the first non-conductive layer to form the first well. After the defining step 408 is complete, the method continues to lining steps 506 and 410.

At lining steps 506 and 410, a second electrically conductive liner is lined along at least one wall of the second well and a first electrically conductive liner is lined along at least one wall of the first well, respectively. The electrically conductive liner partially fills the first and second wells. These steps may be followed with a reactive ion etch (RIE) to remove the second liner along the bottom of the second well. In one embodiment, the first and second electrically conductive liners are TiN. In other embodiments, the first and second electrically conductive liners are TaN, TaAlN, TaSiN, TiAlN, TiSiN, TiCN, or TaCN. After lining step 410 is complete, the method continues to depositing steps 508 and 412.

At depositing steps 508 and 412, phase change material is deposited in the first and second wells, respectively. The phase change material may be in electrical contact with the electrically conductive liner. As discussed above, a variety of materials may be used for the phase change material. The phase change material may include $Ge_2Sb_2Te_5$. The phase change material may include $Sb_xTe_{1-x}$ material, where 0.4 ($Sb_2Te_3$)<=x<=0.7 ($Sb_7Te_3$). The phase change memory cells may include $In_2Se_3$. After depositing steps 508 and 412 are completed, the method proceeds to forming step 510.

During forming step 510, a top electrode is formed above the second well. In one embodiment, the top electrode is TiN. The top electrode may be in physical contact with the phase change material in the second well.

Figure 6A:
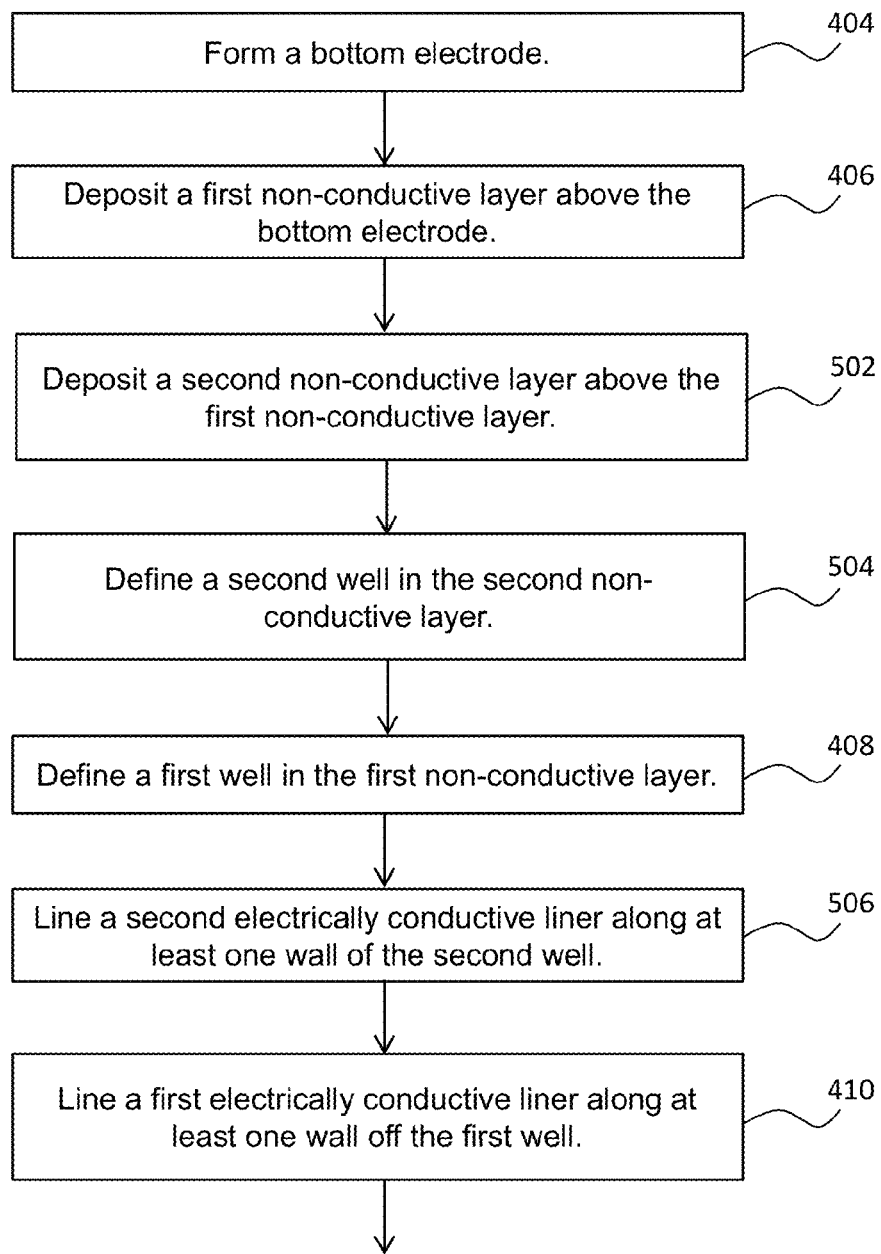
FIGS. 6A and 6B show a further method for fabricating a phase change memory cell in accordance with one embodiment of the present invention.
Figure 6B:
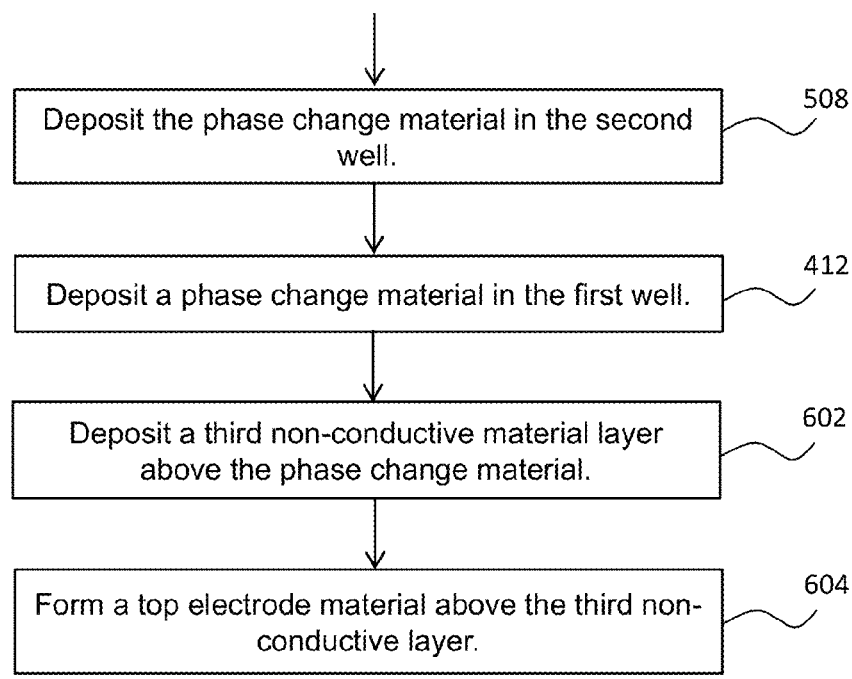

FIGS. 6A and 6B show a method for fabricating a phase change memory cell in accordance with a further embodiment of the present invention. The method includes forming step 404, depositing step 406, depositing step 502, defining step 504, defining step 408, lining step 506, lining step 410, depositing step 508, and depositing step 412, as discussed above. After depositing step 508 is complete, the method continues to depositing step 602.

During depositing 602, a third non-conductive material layer is deposited above the phase change material and within the second well. In one embodiment, the third non-conductive material layer is comprised of Si3N4.

Depositing step 602 may include spinning on a NFC (near frictionless carbon) material which will planarize the surface. Next, a RIE etch is performed to etch back the NFC. The exposed SiN layer is then selectively etched using DHF or hot phosphoric acid. Next, the exposed phase change material is etched using RIE or wet etch, for example. Finally, the NFC is removed using RIE or wet etch. After depositing step 602 is complete, the method continues to forming step 604.

During the forming step 604, a top electrode material is formed above the third non-conductive material layer. The top electrode material may be physical contact with the third non-conductively material layer, the phase change material layer, and the second electrically conductive liner. In one embodiment, forming step 604 may include an Ar sputter clean, a Ti deposition, a CVD and TiN deposition, and a CVD and W deposition.

Accordingly, one embodiment of the invention is a phase change memory cell with a volume of phase change material connecting the top electrode and the bottom electrode. The phase change material is programmable between the fully crystalline and fully amorphous states, and may also be programmed in a partially amorphous state. In one embodiment of the invention, the phase change material may be in parallel to a conductive liner material. In this arrangement, the non-phase change material also makes a connection between the top electrode and bottom electrode. The effective resistance of the phase change memory cell is also the resistance of the phase change material in parallel with the conductive liner.

If the conduction path has the conductive liner material and the phase change material in parallel, the cell may require that the resistivity of the conductive liner material be greater than the resistivity of the phase change material when in the crystalline state (SET state). For example, the resistance of the conductive liner material may be at least two times the resistance of the phase change material when in the fully crystalline (SET) state.

Embodiments of the invention include a phase change memory cell structure and a method to build said structure. The phase change memory cell advantageously includes a large surface area of contact between the phase change material and the electrode material while to maintaining a small effective electrode cross-sectional area.

In one embodiment, the first well is filled partially with the phase change material and partially with an electrode material layer. TiN or TaN may be used for the electrode material layer. Al, Si, C, or N doping may also be used inside of the electrode material layer to increase the resistivity. In one embodiment of the invention, a reactive ion etch (RIE) may be used to remove the electrode material layer in physical contact with and parallel to the first non-conductive layer. In this embodiment, the phase change material may be deposited to completely fill the lower pore.

In one embodiment, the phase change material of the phase change memory cell fills the second well entirely and the electrically conductive liner is disconnected between the first well and the second well, the thermodynamic properties and electro-conductive properties may be tuned to prevent an increased programming current that may result from heat conduction along the lower pore. This embodiment may have cell characteristics in between a standard mushroom cell with a lower pore completely filled with a non-phase change conductive material, and a cell with no electrically conductive liner such that the lower pore is filled with a phase change material only.

In one embodiment, the phase change material fills the lower pore and lines a cavity in the second non-conductive layer. In this embodiment, there can be a third non-conductive layer deposited above the phase change material layer. Si3N4 may be used for the third non-conductive layer. In another embodiment the third non-conductive layer may be selectively etched using compositions such as DHF or phosphoric acid. The phase change material of this embodiment may also be etched using RIE or wet etch.

In one embodiment, a top electrode material may be deposited above the third non-conductive layer such that it is also in contact with the phase change material and the electrically conductive liner. The top electrode material may include Ti, TiN, TaN, and W.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory cell comprising:
   a bottom electrode;
   a first non-conductive layer deposited above the bottom electrode;
   a first well defined by the first non-conductive layer and positioned directly above the bottom electrode;
   a first electrically conductive liner at least partially lining the first well such that the first electrically conductive liner is in electrical contact with the bottom electrode; and
   a phase change material deposited in the first well such that the phase change material is in electrical contact with the first electrically conductive liner;
   a top electrode; and
   wherein the first electrically conductive liner is in physical contact with both the bottom electrode and the top electrode; and
   wherein the phase change material is in physical contact with both the bottom electrode and the top electrode.

2. A phase change memory cell comprising:
   a bottom electrode;
   a first non-conductive layer deposited above the bottom electrode;
   a first well defined by the first non-conductive layer and positioned directly above the bottom electrode;
   a first electrically conductive liner at least partially lining the first well such that the first electrically conductive liner is in electrical contact with the bottom electrode;
   a phase change material deposited in the first well such that the phase change material is in electrical contact with the first electrically conductive liner;
   a second non-conductive layer deposited above the first non-conductive layer; and
   a second well defined by the second non-conductive layer and positioned directly above the first well; and
   a second electrically conductive liner lining at least one wall of the second well such that the second electrically conductive liner is in physical contact with the first electrically conductive liner; and
   wherein the phase change material is deposited in the second well.

3. The phase change memory cell of claim 2, further comprising a top electrode positioned in the second well and in physical contact with the phase change material in the second well.

4. The phase change memory cell of claim 2, wherein the phase change material is deposited in the first well and defines a cavity within the second well.

5. The phase change memory cell of claim 4, further comprising a third non-conductive layer deposited above the phase change material and inside the second well.

6. The phase change memory cell of claim 5, further comprising a top electrode positioned above the third non-conductive layer such that the top electrode is in physical contact with the third non-conductively layer, the phase change material, and the second electrically conductive liner.

7. The phase change memory cell of claim 6, wherein the top electrode includes at least one of Ti, TiN, TaN, and W.

8. The phase change memory cell of claim 1, wherein the first electrically conductive liner includes at least one of TiN, TaN, TaAlN, TaSiN, TiAlN, TiSiN, TiCN, and TaCN.

9. The phase change memory cell of claim 1, wherein the first electrically conductive liner has at least twice an electrical resistance as the phase change material when in a crystalline phase.

10. The phase change memory cell of claim 2, wherein the first electrically conductive liner contacts a bottom of the first well such that the first electrically conductive liner is physically positioned between the phase change material and the bottom electrode.

11. The phase change memory cell of claim 2, wherein the first electrically conductive liner and the second electrically conductive liner includes at least one of TiN, TaN, TaAlN, TaSiN, TiAlN, TiSiN, TiCN, and TaCN.

12. The phase change memory cell of claim 2, wherein the first electrically conductive liner has at least twice an electrical resistance as the phase change material when in a crystalline phase.

* * * * *